United States Patent [19]

Vermeersch et al.

[11] Patent Number: 5,786,128
[45] Date of Patent: *Jul. 28, 1998

[54] ON-PRESS DEVELOPMENT OF A LITHOGRAPHIC PRINTING PLATE HAVING AN ARYLDIAZOSULFONATE RESIN IN A PHOTOSENSITIVE LAYER

[75] Inventors: Joan Vermeersch, Deinze; Marc Van Damme, Heverlee, both of Belgium

[73] Assignee: AFGA-Gevaert, N.V., Mortsel, Belgium

[*] Notice: The term of this patent shall not extend beyond the expiration date of Pat. No. 5,776,653.

[21] Appl. No.: 715,500

[22] Filed: Sep. 18, 1996

[30] Foreign Application Priority Data

Oct. 31, 1995 [EP] European Pat. Off. .............. 95202936

[51] Int. Cl.$^6$ ....................... G03F 7/021; G03C 1/56
[52] U.S. Cl. ..................... 430/302; 430/164; 430/188; 101/467
[58] Field of Search ........................ 430/188, 164, 430/57, 158, 159, 160, 302; 101/467

[56] References Cited

U.S. PATENT DOCUMENTS 5,333,548 8/1994 Fadner ....................... 101/467
5,607,816 3/1997 Fitzgerald et al. ............. 430/302
5,677,110 10/1997 Chia et al. .................... 430/302

*Primary Examiner*—John S. Chu
*Attorney, Agent, or Firm*—Breiner & Breiner

[57] ABSTRACT

The present invention discloses a method for making a lithographic printing plate comprising the steps of:

(1) image-wise exposing an imaging element having on a hydrophilic surface of a lithographic base a photosensitive layer comprising a photosensitive polymer containing aryl-diazosulfonate units;

(2) and developing a thus obtained image-wise exposed imaging element by mounting it on a print cylinder of a printing press and supplying an aqueous dampening liquid and/or ink to said photosensitive layer while rotating said print cylinder.

Excellent printing results are obtained with a printing plate perpared according to the above described method. The lithographic base may be an anodized aluminium or a support provided with an ink-repellant layer containing a cross-linked hydrophilic binder.

8 Claims, No Drawings

ON-PRESS DEVELOPMENT OF A LITHOGRAPHIC PRINTING PLATE HAVING AN ARYLDIAZOSULFONATE RESIN IN A PHOTOSENSITIVE LAYER

DESCRIPTION

1. Field of the Invention

The present invention relates to a method for making a printing plate involving the use of a aryldiazosulfonate resin based printing plate. In particular, the method of the present invention involves on press development of an aryldiazosulfonate resin based printing plate.

2. Background of the Invention

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Several types of supports can be used for the manufacturing of a diazo-sensitized lithographic printing plate. Common supports are metal supports like Al or Zn and paper bases. These supports, if not sufficient hydrophilic by themselves, are first coated with a hydrophilic layer to form the hydrophilic background of the printing plate and a top layer containing the diazo compound is then applied (see for example DE-P-1900469, DE-P-2030634 and U.S. Pat. No. 3,971,660).

It is known to use as hydrophilic layer in these systems a layer containing polyvinyl alcohol and hydrolyzed tetraethyl orthosilicate and preferably also silicium dioxide and/or titanium dioxide as described in e.g. EP-A 601240, GB-P-1419512, FR-P-2300354, U.S. Pat. Nos. 3,971,660 and 4,284,705. This hydrophilic layer is overcoated with a light-sensitive layer containing a diazo resin or a diazonium salt in a polymeric binder.

Upon image-wise exposure of the light-sensitive layer the exposed image areas become water insoluble and the unexposed areas remain water soluble. The plate is then developed with water to remove the diazonium salt or diazo resin in the unexposed areas.

Commercially available diazo based printing plates most commonly use an anodized and roughened aluminium as a support having a hydrophilic surface. Printing plates of this type offer the advantage of high printing endurance, resolution and sharpness. However, they require special developing liquids and dedicated processors to process the printing plates. Such procedure is time consuming, inconvenient and puts a burden on the environment.

On the other hand commercial plates are also available that use a flexible support such as paper provided with a hydrophilic layer. For example, Lithocraft 10008 FOTO-PLATE™ is a diazo based printing plate that comprises on a paper support a hydrophilic layer on top of which is provided a diazo based photosensitive layer. According to plate instructions of the supplier, a plate can be prepared by image-wise exposure of the lithographic printing plate precursor or imaging element, mounting the exposed imaging element on the press and wiping its surface with Lithocraft® 10008 Developer Desensitizer. The plate instructions also contemplate a method wherein no developer desensitizer is used. However, such method most often results in poor lithographic preformance so that in practice a Developer Desensitizer is almost always needed.

EP-A 339393 and EP-A 507008 disclose the use of aryldiazosulfonate resins in a photosensitive layer of an imaging element for making a lithographic printing plate. According to these disclosures, the imaging elements can be developed by rinsing them with plain water.

SUMMARY OF THE INVENTION

It is an object of the present invention to provide a convenient and environmental friendly way of obtaining printing plates that yield excellent printing properties such as printing endurance, ink-acceptance of the image areas and ink-repellance of the non image areas.

Further objects of the present invention will become clear from the description hereinafter.

According to the present invention there is provided a method for making a lithographic printing plate comprising the steps of:

(1) image-wise exposing an imaging element having on a hydrophilic surface of a lithographic base a photosensitive layer comprising a photosensitive polymer containing aryl-diazosulfonate units;

(2) and developing a thus obtained image-wise exposed imaging element by mounting it on a print cylinder of a printing press and supplying an aqueous dampening liquid and/or ink to said photosensitive layer while rotating said print cylinder.

There is further provided a method for making multiple copies of an original comprising the steps of:

(1) image-wise exposing an imaging element having on a hydrophilic surface of a lithographic base a photosensitive layer comprising a photosensitive polymer containing aryl-diazosulfonate units;

(2) mounting a thus obtained image-wise exposed imaging element without development, on a print cylinder of a printing press;

(3) rotating said print cylinder while supplying an aqueous dampening liquid and/or supplying ink to said photosensitive layer of said imaging element and (4) transfering ink from said imaging element to a receiving element, generally a paper sheet.

DETAILED DESCRIPTION OF THE INVENTION

In accordance with the present invention it has been found that excellent printing properties can be obtained from a printing plate that is developed on press and that uses an aryldiazosulfonate resin in the photosensitive layer of the imaging element from which the printing plate is prepared. In particular, the present invention allows for on-press development of imaging elements having as a lithographic base an anodised aluminium support or a lithographic base comprising on a support an ink-repellant layer containing a cross-linked hydrophilic binder.

A photosensitive polymer having aryldiazosulfonate units, also called aryldiazosulfonate resin, preferably is a polymer having aryldiazosulfonate units corresponding to the following formula:

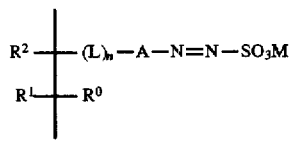

wherein $R^{0,1,2}$ each independently represent hydrogen, an alkyl group, a nitrile or a halogen, e.g. Cl, L represents a divalent linking group, n represents 0 or 1, A represents an aryl group and M represents a cation.

L preferably represents divalent linking group selected from the group consisting of:

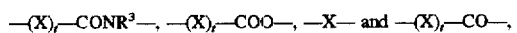

wherein t represents 0 or 1, $R^3$ represents hydrogen, an alkyl group or an aryl group, X represents an alkylene group, an arylene group, an alkylenoxy group, an arylenoxy group, an alkylenethio group, an arylenethio group, an alkylenamino group, an arylenamino group, oxygen, sulfur or an amino-group.

A preferably represents an unsubstituted aryl group, e.g. an unsubstituted phenyl group or an aryl group, e.g. phenyl, substituted with one or more alkyl group, aryl group, alkoxy group, aryloxy group or amino group.

M preferably represents a cation such as $NH_4^+$ or a metal ion such as a cation of Al, Cu, Zn, an alkaline earth metal or alkali metal.

A polymer having aryldiazosulfonate units is preferably obtained by radical polymerisation of a corresponding monomer. Suitable monomers for use in accordance with the present invention are disclosed in EP-A 339393 and EP-A 507008. Specific examples are:

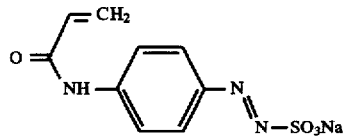
M1

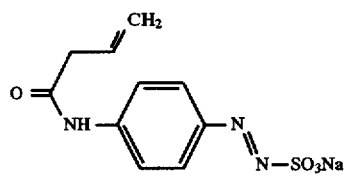
M2

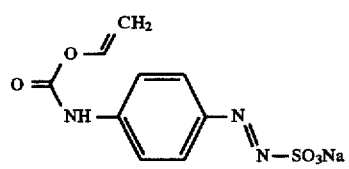
M3

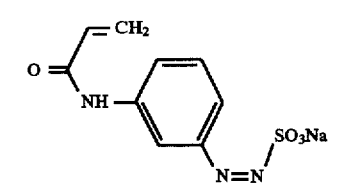
M4

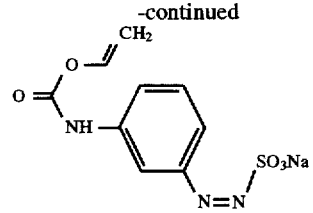
M5

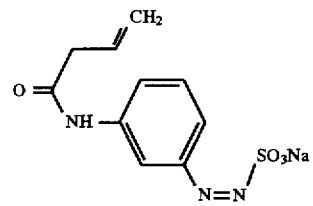
M6

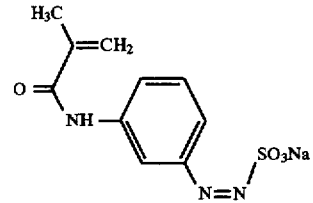
M7

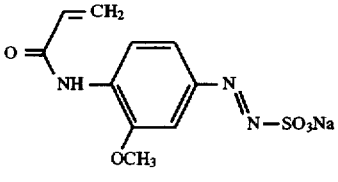
M8

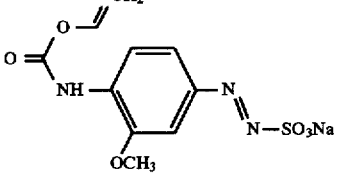
M9

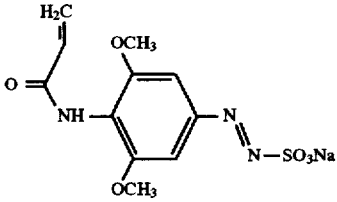
M10

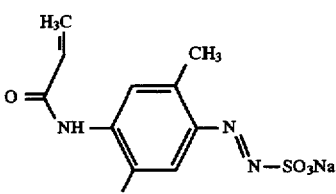
M11

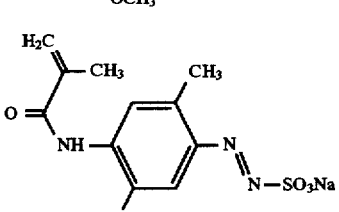
M12

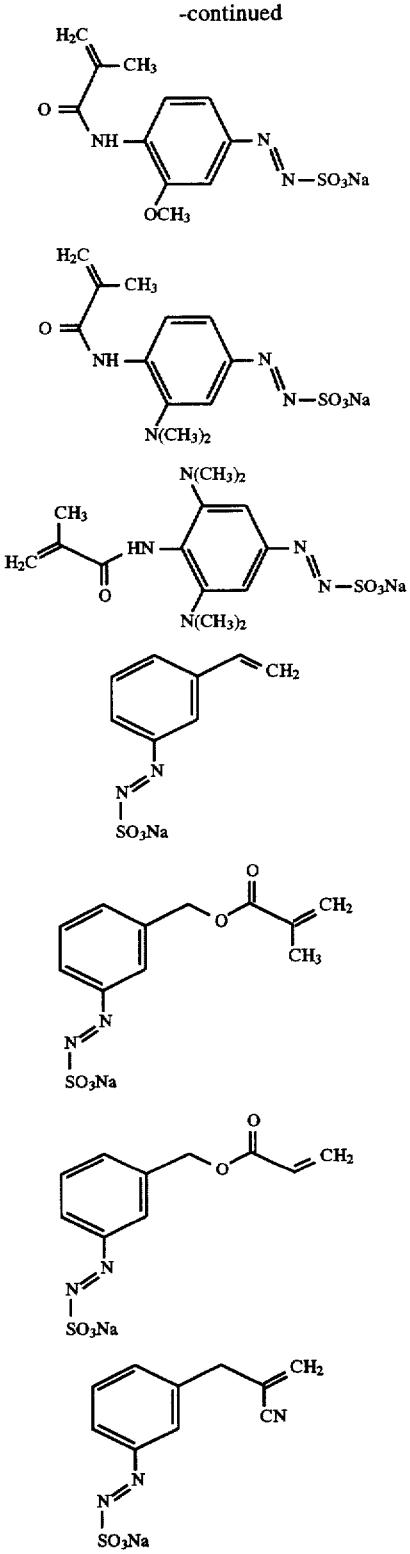

Aryldiazosulfonate monomers, e.g. as disclosed above, can be homopolymerised or copolymerised with other aryldiazosulfonate monomers and/or with vinyl monomers such as (meth)acrylic acid or esters thereof, (meth)acrylamide, acrylonitrile, vinylacetate, vinylohloride, vinylidene chloride, styrene, alpha-methyl styrene etc.. In case of copolymers however, care should be taken not to impair the water solubility of the polymer. Preferably, the amount of aryldiazosulfonate groups in a polymer in connection with this invention is between 10 mol % and 60 mol %.

According to another embodiment in connection with the present invention, an aryldiazosulfonate containing polymer may be prepared by reacting a polymer having e.g. acid groups or acid halide groups with an amino or hydroxy substituted aryldiazosulfonate. Further details on this procedure can be found in EP-A 507008.

According to a perferred embodiment in connection with the present invention, the lithographic base can be an anodised aluminium. A particularly preferred lithographic base is an electrochemically grained and anodised aluminium support. According to the present invention, an anodised aluminium support may be treated to improve the hydrophilic properties of its surface. For example, the aluminium support may be silicated by treating its surface with sodium silicate solution at elevated temperature, e.g. 95° C. Alternatively, a phosphate treatment may be applied which involves treating the aluminium oxide surface with a phosphate solution that may further contain an inorganic fluoride. Further, the aluminium oxide surface may be rinsed with a citric acid or citrate solution. This treatment may be carried out at room temperature or can be carried out at a slightly elevated temperature of about 30° to 50° C. A further interesting treatment involves rinsing the aluminium oxide surface with a bicarbonate solution. It is further evident that one or more of these post treatments may be carried out alone or in combination.

According to another embodiment in connection with the present invention, the lithographic base comprises a flexible support, such as e.g. paper or plastic film, provided with an ink-repellant layer comprising a cross-linked hydrophilic binder. A particularly suitable ink-repellant layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

An ink-repellant layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the ink-repellant layer is given a uniform rough texture consisting of microscopic hills and valleys, which serve as storage places for water in background areas.

The thickness of an ink-repellant layer in a lithographic base in accordance with this embodiment may vary in the range of 0.2 to 25 μm and is preferably 1 to 10 μm.

Particular examples of suitable ink-repellant layers for use in accordance with the present invention are disclosed in EP-A 601240, GB-P-1419512, FR-P-2300354, U.S. Pat. No. 3,971,660, U.S. Pat. No. 4,284,705 and EP-A 514490.

As flexible support of a lithographic base in connection with the present embodiment it is particularly preferred to use a plastic film e.g. substrated polyethylene terephthalate film, polyethylene naphthalate film, cellulose acetate film, polystyrene film, polycarbonate film etc . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A 619524, EP-A 620502 and EP-A 619525. Preferably, the amount of silica in the adhesion improving layer is 200 mg per $m^2$ and 750 mg per $m^2$. Further, the ratio of silica to hydrophilic binder is preferably more than 1 and the surface area of the colloidal silica is preferably at least 300 $m^2$ per gram, more preferably a surface area of 500 $m^2$ per gram.

In accordance with the present invention, on top of a hydrophilic surface there is provided a photosensitive layer. Optionally, there may be provided one or more intermediate layers between the lithographic base and the photosensitive layer.

In addition to the aryldiazosulfonate resin, the photosensitive layer according to the present invention preferably contains dispersed water-insoluble polymers. The aqueous dispersion of water insoluble polymer is preferably cationic or nonionic either e.g. as a result of an emulsifier or by having the anionic or nonionic group linked to the polymer. The water insoluble polymer is preferably a solid particulate having a size in the range of about 100 Angstroms to 1 micron in diameter and does not form a film below 30° C. In general, any polymer which carries an anionic or nonionic group or which can be formulated into an emulsion using an anionic or nonionic emulsifier can be employed in the present invention. Suitable polymers include homopolymers and copolymers of styrene, methylacrylate, ethylacrylate, butylacrylate, methylmethacrylate, ethylmethacrylate, butyl methacrylate, vinyl acetate, vinyl chloride, vinylidene chloride, butadiene, methyl styrene, vinyl toluene, dimethylaminoethyl acrylate, acrylic acid, methacrylic acid, isoprene, chloroprene, malei anhydride, ethylene glycol acrylates such as polyethylene glycol acrylate, halogenated vinyl aromatics such as chlorostyrene and bromostyrene, methylvinyl ether, vinyl pyrrolidone, polyurethane and the like.

The thickness of the photosensitive layer in the material of this invention may vary in the range of 0.1 to 10 μm and is preferably between 0.5 and 2.5 μm.

The photosensitivity of an imaging element in connection with the present invention is preferably such that an exposure to day light to an extent of not more than 250 000 lux.s does not substantially result in changes in the lithographic behaviour of the printing plate. This will allow sufficient convenience in handling and mounting of an image-wise exposed imaging element. The photosensitivity of the imaging element may be easily adapted by appropriate choice of a particular aryldiazosulfonate resin, the amount thereof and the thickness of the photosensitive layer.

The imaging element in connection with the present invention advantageously contains water-soluble dyes such as rhodamines, phtalocyanines, sudan blue, methylen blue, eosin or triphenylmethane dyes such as crystal violet, victoria pure blue, malachite green, methylviolet and fuchsin or dye pigments. These colorants may be incorporated in the photosensitive layer and/or ink-repellant layer.

The exposure of the imaging element used in the present invention advantageously proceeds with ultraviolet light optionally in combination with blue light in the wavelength range of 250 to 500 nm. Useful exposure sources are high or medium pressure halogen mercury vapour lamps, e.g. of 1000 W. Since most lithography is done by the offset process, the imaging element is exposed in such a way that the image obtained thereon is right reading. The exposure may be an exposure using optics or a contact exposure.

Subsequent to image-wise exposure, the image-wise exposed imaging element, after optional wiping, is mounted on a print cylinder of a printing press with the backside of the imaging element (side of the support opposite to the side having the photosensitive layer). According to a preferred embodiment, the printing press is then started and while the print cylinder with the imaging element mounted thereon rotates, the dampener rollers that supply dampening liquid are dropped on the imaging element and subsequent thereto the ink rollers are dropped. Generally, after about 10 revolutions of the print cylinder the first clear and useful prints are obtained.

According to an alternative method, the ink rollers and dampener rollers may be dropped simultaneously or the ink rollers may be dropped first.

Preferably, the photosensitive layer of an image-wise exposed imaging element in accordance with the present invention is wiped with e.g. a cotton pad or sponge soaked with water before mounting the imaging element on the press or at least before the printing press starts running. This will remove some unexposed aryldiazosulfonate resin but will not actually develop the imaging element. However, it has the advantage that possible substantial contamination of the dampening system of the press and ink used is avoided.

An exposed imaging element in accordance with the present invention is preferably mounted on a printing press and used to print shortly after the exposure. It is however possible to store an exposed imaging element for some time in the dark before using it on a printing press to print copies.

Suitable dampening liquids that can be used in connection with the present invention are aqueous liquids generally having an acidic pH and comprising an alcohol such as isopropanol. With regard to dampening liquids useful in the present invention, there is no particular limitation and commercially available dampening liquids, also known as fountain solutions, can be used.

The invention will now be illustrated by the following examples without however the intention to limit the invention thereto. All parts are by weight unless stated otherwise.

EXAMPLE 1

Preparation of a Lithographic Base

A 0.2 mm thick aluminium foil was degreased by immersing the foil in an aqueous solution containing 5 g/l of sodium hydroxide at 50° C. and rinsed with demineralised water. The foil was then electrochemically grained using an alternating current in an aqueous solution containing 4 g/l of hydrochloric acid, 4 g/l of hydroboric acid and 0.5 g/l of aluminium ions at a temperature of 35° C. and a current density of 1200 A/$m^2$ to form a surface topography with an average center-line roughness $R_a$ of 0.5 μm.

After rinsing with demineralised water the aluminium foil was then etched with an aqueous solution containing 300 g/l of sulfuric acid ate 60° C. for 180 seconds and rinsed with demineralised water at 25° c. for 30 seconds.

The foil was subsequently subjected to anodic oxidation in an aqueous solution containing 200 g/l of sulfuric acid at at temperature of 45° c., a voltage of about 10V and a current density of 150 A/m² for about 300 seconds to form an anodic oxidation film of 3 g/m² Al₂O₃, then washed with demineralised water, post treated with a solution containing 20 g/l of sodium bicarbonated at 40° C. for 30 s, subsequently rinsed with demineralised water of 20° C. during 120 s and dried.

The obtained lithographic base was submersed in an aqueous solution containing 5% by weight of citric acid for 60 s, rinsed with demineralised wter and dried at 40° C.

Preparation of the Imaging Element (Material)

An imaging element according to the invention was produced by preparing the following coating composition and coating it to the above described lithographic base in an amount of 30 g/m² (wet coating amount) and drying it at 35° C.

Preparation of Coating Composition 2 gram of a copolymer of 3-methacrylamidophenylazosulfonate and methylmethacrylate (molar ratio 60/40), was dissolved in 66 ml of demineralised water and wetting agent was added thereto.

Preparation of a Printing Plate and Printed Copies Therefrom

An imaging element as described above was exposed through an original (mask) to a high pressure halogen mercury vapour lamp in a DL2000™ (commercially available from Agfa-Gevaert NV) contact frame exposure apparatus. The exposed imaging element was then mounted on an ABD360™ offset printing press equipped with a VARN™ KOMPAC II dampening system. As ink, VanSon RB2329™ and as dampening liquid G671c™ (3% in water) commercially available from Agfa-Gevaert NV were used.

Subsequently, the press was started by allowing the print cylinder with the imaging element mounted thereon to rotate. The dampener rollers of the press were then dropped on the imaging element so as to supply dampening liquid to the imaging element and after 10 revolutions of the print cylinder, the ink rollers were also dropped to supply ink. After 10 further revolutions clear prints were obtained with no ink uptake in the non-image parts.

EXAMPLE 2

An imaging element was prepared as described in example 1 with the exception that the submersion of the lithographic base in a citric acid solution was omitted and the lithographic base was directly coated with the coating composition.

A printing plate was prepared as in example 1 and after a total of 20 revolutions of the print cylinder, clear prints were obtained without ink uptake in the non-image areas.

EXAMPLE 3

Preparation of a Lithographic Base

To 440 g of a dispersion contg. 21.5% TiO₂ (average particle size 0.3 to 0.5 μm) and 2.5% polyvinyl alcohol in deionized water were subsequently added, while stirring, 250 g of a 5% polyvinyl alcohol solution in water, 105 g of a hydrolyzed 22% tetramethylorthosilicate emulsion in water and 12 g of a 10% solution of a wetting agent.

To this mixture was added 193 g of deionized water and the pH was adjusted to pH=4.

The obtained dispersion was coated on a polyethyleneterephtalate film support (coated with a hydrophilic adhesion layer) to a wet coating thickness of 50 g/m², dried at 30° C. and subsequently hardened by subjecting it to a temperature of 57° C. for 1 week.

An imaging element was prepared as described in example 1 with the exception that the above lithographic base was used instead of the lithographic base described in example 1.

A printing plate and printed copies therefrom were prepared as described in example 1 and after a total of 20 revolutions of the print cylinder, clear prints were obtained without ink uptake in the non-image areas.

We claim:

1. A method for making a lithographic printing plate comprising the steps of:
   (1) image-wise exposing an imaging element having on a hydrophilic surface of a lithographic base a photosensitive layer comprising a photosensitive polymer containing aryl-diazosulfonate units;
   (2) and developing a thus obtained image-wise exposed imaging element by mounting it on a print cylinder of a printing press and supplying an aqueous dampening liquid and/or ink to said photosensitive layer while rotating said print cylinder.

2. A method according to claim 1 wherein said aryldiazosulfonate units are according to the following general formula:

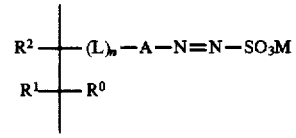

wherein $R^{0,1,2}$ each independently represent hydrogen, an alkyl group, a nitrile or a halogen, L represents a divalent linking group, n represents 0 or 1, A represents an aryl group and M represents a cation.

3. A method according to claim 1 wherein L represents a divalent linking group selected from the group consisting of:

—(X)$_t$—CONR³—, —(X)$_t$—COO—, —X— and —(X)$_t$—CO—, wherein t represents 0 or 1, R³ represents hydrogen, an alkyl group or an aryl group, X represents an alkylene group, an arylene group, an alkylenoxy group, an arylenoxy group, an alkylenethio group, an arylenethio group, an alkylenamino group, an arylenamino group, oxygen,sulfur or an aminogroup.

4. A method according to claim 2 wherein A represents an unsubstituted aryl group or an aryl group substituted with one or more alkyl group, aryl group, alkoxy group, aryloxy group or amino group.

5. A method according to claim 2 wherein M represents NH₄⁺or a metal ion.

6. A method according to claim 1 wherein said lithographic base is an anodised aluminium or comprises a support coated with an ink-repellant layer containing a cross-linked hydrophilic binder.

7. A method for making multiple copies of an original comprising the steps of:
   (1) image-wise exposing an imaging element having on a hydrophilic surface of a lithographic base a photosensitive layer comprising a photosensitive polymer containing aryl-diazosulfonate units;
   (2) mounting a thus obtained image-wise exposed imaging element without development, on a print cylinder of a printing press;
   (3) rotating said print cylinder while supplying an aqueous dampening liquid and/or supplying ink to said photosensitive layer of said imaging element and
   (4) transfering ink from said imaging element to a receiving element.

8. A method according to claim 7 wherein said image-wise exposed imaging element is wiped before rotating said print cylinder while supplying dampening liquid and/or ink.

* * * * *